(12) United States Patent
Sonoda

(10) Patent No.: US 6,678,306 B1
(45) Date of Patent: Jan. 13, 2004

(54) SEMICONDUCTOR LASER DEVICE WITH WAVELENGTH SELECTION AND HIGH-FREQUENCY MODULATION OF DRIVING CURRENT

(75) Inventor: Shinichiro Sonoda, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/576,426

(22) Filed: May 22, 2000

(30) Foreign Application Priority Data

May 21, 1999 (JP) .......................................... 11-141311

(51) Int. Cl.[7] ................................................ H01S 3/08
(52) U.S. Cl. .......................................... 372/96; 372/22
(58) Field of Search ................... 359/332, 326; 331/94; 372/45, 22, 96; 430/5

(56) References Cited

U.S. PATENT DOCUMENTS

| | | | | |
|---|---|---|---|---|
| 3,660,780 A | * | 5/1972 | Iida et al. .................. | 372/43 |
| 5,060,235 A | * | 10/1991 | Ikeda ........................ | 372/23 |
| 5,146,464 A | * | 9/1992 | Uemura .................. | 372/38.07 |
| 5,387,998 A | * | 2/1995 | Kitaoka et al. ............. | 430/22 |
| 5,522,973 A | | 6/1996 | Harada ..................... | 204/164 |
| 5,568,308 A | * | 10/1996 | Harada ..................... | 204/164 |
| 5,570,225 A | | 10/1996 | Harada ..................... | 359/326 |
| 5,617,435 A | * | 4/1997 | Nagai et al. ............... | 359/332 |
| 6,195,198 B1 | * | 2/2001 | Hatori ....................... | 359/332 |
| 6,319,638 B1 | * | 11/2001 | Inomoto .................... | 430/22 |
| 6,385,219 B1 | * | 5/2002 | Sonoda ...................... | 372/43 |

FOREIGN PATENT DOCUMENTS

JP   10-254001   9/1998   ............. G02F/1/37

OTHER PUBLICATIONS

Patent Abstract of Japan 10–254001 Sep. 25, 1998.

* cited by examiner

Primary Examiner—Paul Ip
Assistant Examiner—Hung Vy
(74) Attorney, Agent, or Firm—Sughrue Mion, PLLC

(57) ABSTRACT

A semiconductor laser device includes a semiconductor laser element having a pair of cleavage planes which allows laser oscillation therebetween in a plurality of Fabry-Perot modes, an external resonator being coupled to the semiconductor laser element and including a wavelength selection element which has a passband including more than one wavelength of more than one Fabry-Perot mode out of the plurality of Fabry-Perot modes, and a high-frequency superimposing unit which superimposes a high-frequency current on a driving current of the semiconductor laser element.

28 Claims, 4 Drawing Sheets

F I G. 3A
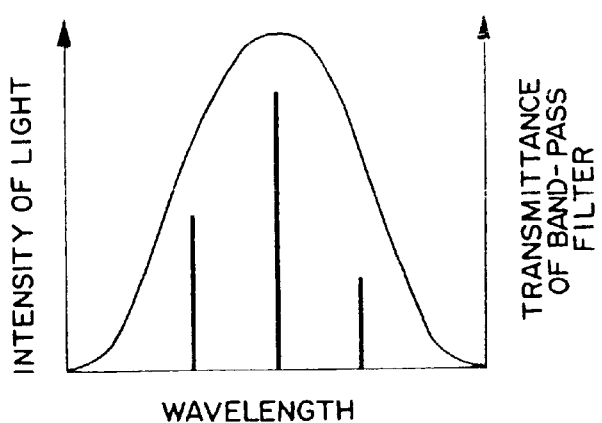
F I G. 3B
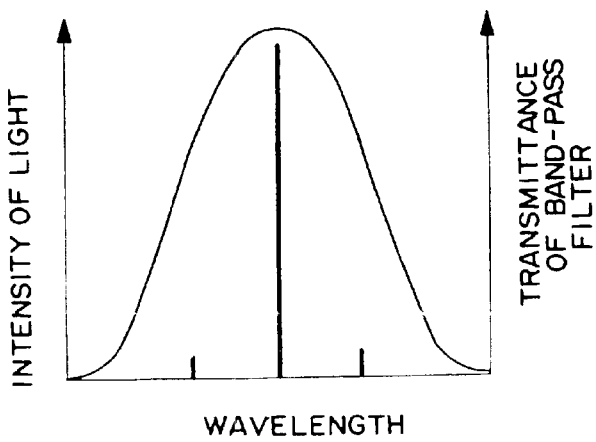

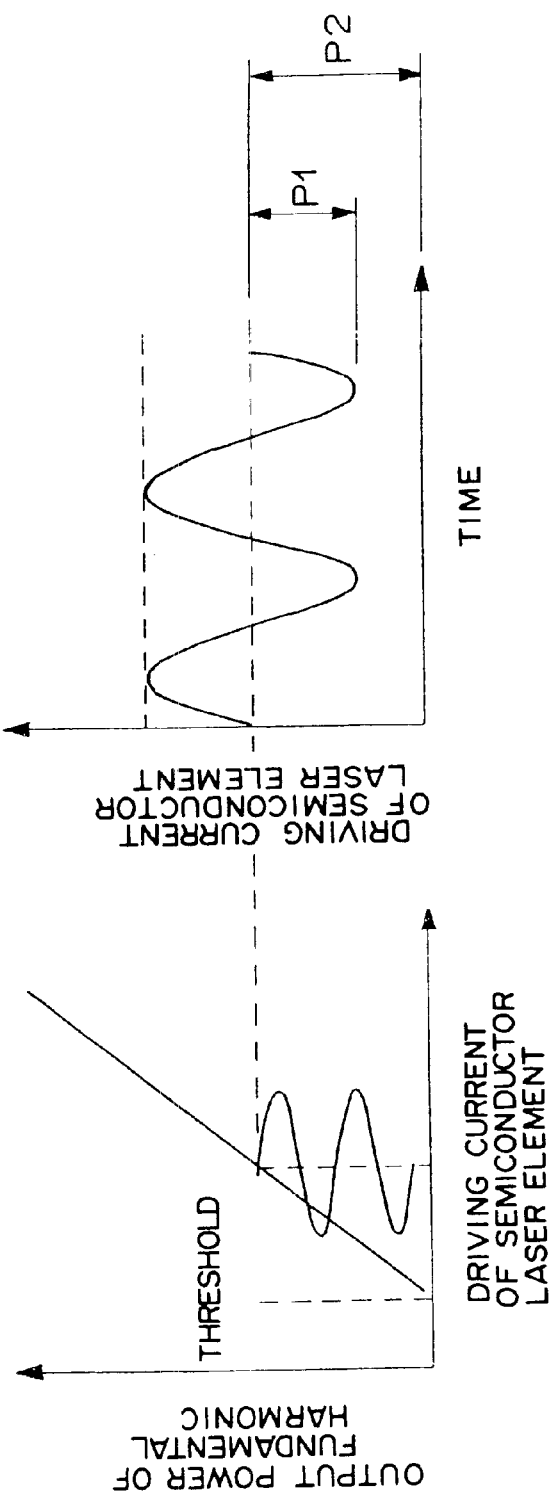

SEMICONDUCTOR LASER DEVICE WITH WAVELENGTH SELECTION AND HIGH-FREQUENCY MODULATION OF DRIVING CURRENT

BACKGROUND OF THE INVENTION

1. Field of the Invention

The present invention relates to a semiconductor laser device provided with an external resonator including a wavelength selection element. The present invention also relates to a semiconductor laser module including a semiconductor laser device and an optical wavelength conversion element which converts the wavelength of a laser beam emitted from the semiconductor laser device, to generate its second harmonic or the like.

2. Description of the Related Art

As disclosed in Japanese Unexamined Patent Publication No. 10(1998)-254001, conventionally, laser light generated by a semiconductor laser device is converted into its second harmonic by using a wavelength conversion element. That is, the wavelength of the laser light emitted from the semiconductor laser device is reduced by half. In addition, an attempt has been made to use a second harmonic having a blue or green wavelength for recording a color image in an optical-scan type recording apparatus such as a laser printer.

On the other hand, as disclosed in Japanese Unexamined Patent Publication No. 10(1998)-254001, another attempt has been made to lock the wavelength of laser light emitted from a semiconductor laser device at a desired wavelength by combining an external resonator with the semiconductor laser device when laser light emitted from the semiconductor laser device is converted into its second harmonic, where the external resonator contains a wavelength selection element such as a narrow-band-pass filter.

In the case where a semiconductor laser device is coupled to an external resonator including a wavelength selection element, if the passband of the wavelength selection element is broader than the Fabry-Perot mode interval (i.e., the difference between wavelengths of two adjacent Fabry-Perot (FP) modes, among a plurality of FP modes), which are determined by the interval of a pair of cleavage planes of the semiconductor laser device, laser oscillation in the semiconductor laser device occurs in a plurality of longitudinal modes. For example, when the Fabry-Perot mode interval in the semiconductor laser device is about 0.2 nm, and the width of a passband of the wavelength selection element is 0.5 nm, laser oscillation in the semiconductor laser device may occur in two or three longitudinal modes, where the width of the passband of the wavelength selection element is the half-value width of the passband, i.e., a bandwidth in which the transmittance of the wavelength selection element is equal to or more than half of the maximum value of the transmittance in the passband.

In the above situation in which the laser oscillation in the semiconductor laser device occurs in a plurality of longitudinal modes, the allocation of power to the respective longitudinal modes may vary with time, even if the driving current of the semiconductor laser device is fixed. This phenomenon occurs when a specific amount of driving current is supplied to the semiconductor laser device, and is called longitudinal mode competition.

In FIGS. 3A and 3B, the transmittance of the narrow-band-pass filter is indicated by curves, and the light intensities of the three longitudinal modes are indicated by vertical bars. As illustrated in FIGS. 3A and 3B, the light intensities of the respective longitudinal modes vary due to the variation in the allocation of power to the respective longitudinal modes.

When the longitudinal mode competition occurs, the intensity of light which is fed back to the semiconductor laser device varies with time (i.e., with the varying oscillation state of the external resonator), due to the difference in the transmittance of the wavelength conversion element at the wavelengths of the respective longitudinal modes. Accordingly, the oscillation state of the semiconductor laser device also varies with time, and therefore the intensity of the output of the semiconductor laser device varies with time. When the output light of the semiconductor laser device is converted into the second harmonic, the second harmonic also varies with time.

In addition, in the case where the second harmonic is generated by using a wavelength conversion element, for example, the tolerance of the wavelength for phase matching is about 0.2 nm when the coupling length is 6 mm, and the wavelength of the second harmonic is in the range of 450 to 550 nm. That is, the tolerance of the wavelength for phase matching is smaller than the bandwidth of the oscillation wavelength of the semiconductor laser device. Therefore, when the substantial oscillation wavelength varies due to the longitudinal mode competition, the efficiency of the wavelength conversion also varies. Thus, the variation of the luminous energy of the second harmonic is further increased due to the small tolerance of the wavelength for phase matching.

The frequency of the variation of the luminous energy of the second harmonic caused as above is in the range of 0 to 10 MHz. Therefore, when the above second harmonic is used for recording a color image in an optical-scan-type recording apparatus such as a laser printer, the variation of the luminous energy of the second harmonic causes noise or unevenness in the recorded image.

SUMMARY OF THE INVENTION

An object of the present invention is to provide a semiconductor laser device comprised of a semiconductor laser element and an external resonator including a wavelength selection element, wherein occurrence of longitudinal mode competition can be prevented even when the passband of the wavelength selection element includes a plurality of wavelengths of a plurality of Fabry-Perot modes of the semiconductor laser element.

Another object of the present invention is to provide a semiconductor laser module comprised of a semiconductor laser element, an external resonator including a wavelength selection element, and an optical wavelength conversion element performing wavelength conversion on laser light emitted from the semiconductor laser element, wherein intensity variation in the wavelength-converted laser light can be suppressed even when the passband of the wavelength selection element includes a plurality of wavelengths of a plurality of Fabry-Perot modes of the semiconductor laser element.

According to the first aspect of the present invention, there is provided a semiconductor laser device which includes a semiconductor laser element, an external resonator which is coupled to the semiconductor laser element, and a high-frequency superimposing unit.

The semiconductor laser element has a pair of cleavage planes, and laser oscillation in a plurality of Fabry-Perot modes can be realized between the pair of cleavage planes.

The external resonator includes a wavelength selection element having a passband which includes more than one wavelength of more than one Fabry-Perot mode out of the above plurality of Fabry-Perot modes. The high-frequency superimposing unit superimposes a high-frequency current on a driving current of the semiconductor laser element.

According to the second aspect of the present invention, there is provided a semiconductor laser module which comprises the above semiconductor laser device according to the first aspect of the present invention, and an optical wavelength conversion element which converts the wavelength of the laser light emitted from the semiconductor laser device.

Due to the superimposition of the high-frequency current on the driving current of the semiconductor laser element, the driving current of the semiconductor laser element does not stay in a region in which the longitudinal mode competition occurs. That is, due to the superimposition of the high-frequency current, the driving current quickly passes through the above region. Therefore, the longitudinal mode competition can be suppressed, and the variation in the luminous energy of the second harmonic can be suppressed.

In the first and second aspects of the present invention, it is preferable that the degree of modulation of the driving current with the high-frequency current is in the range of 70% to 100%. It is further preferable that the degree of modulation with the high-frequency current is 100%.

In the case where the wavelength-converted laser light which is output from the semiconductor laser module according to the second aspect of the present invention is used as recording light in the optical-scan-type recording apparatus, it is preferable that the frequency of the high-frequency current is greater than a reciprocal of a cycle time of an operation of writing a pixel in an optical-scan-type recording apparatus, and smaller than a response frequency of the semiconductor laser device. When the frequency of the high-frequency current is within this range, visible noise in an image printed by the optical-scan-type recording apparatus can be suppressed.

In addition, when the wavelength-converted laser light which is output from the semiconductor laser module according to the second aspect of the present invention is used as recording light in the optical-scan-type recording apparatus, it is preferable that the frequency of the high-frequency current is in the range of 10 MHz to 2 GHz. It is further preferable that the frequency of the high-frequency current is in the range of 10 MHz to 50 MHz.

DESCRIPTION OF THE DRAWINGS

FIGS. 3A and 3B are graphs illustrating variations of the intensities of oscillation in the respective longitudinal modes within the passband of the wavelength selection element.

FIG. 4A is a graph illustrating a relationship between the driving current and the output power of the fundamental harmonic of the semiconductor laser element.

FIG. 4B is a graph illustrating an example of a waveform of the driving current of the semiconductor laser element.

DESCRIPTION OF PREFERRED EMBODIMENTS

Embodiments of the present invention are explained in detail below with reference to drawings.

Figure 1:
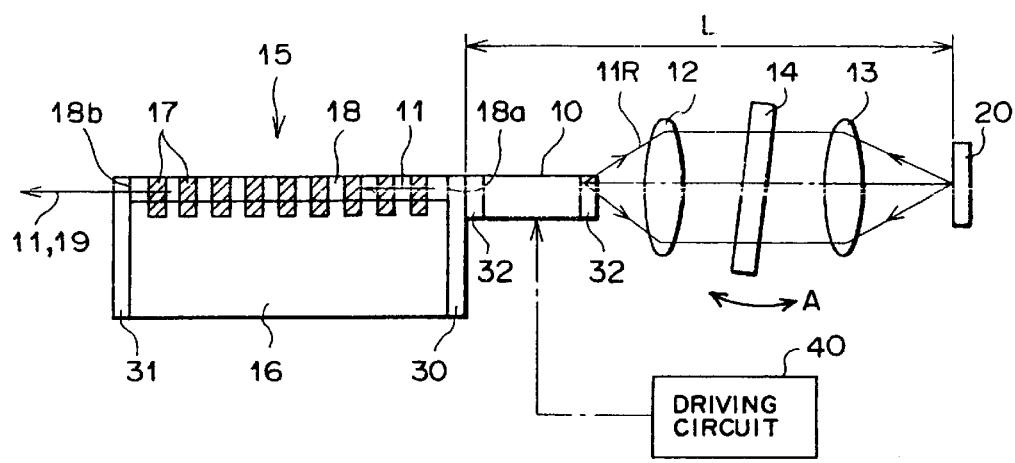
FIG. 1 is a diagram illustrating the construction of an embodiment of the semiconductor laser module according to the present invention.

FIG. 1 is a diagram illustrating the construction of an embodiment of the semiconductor laser module according to the present invention. The semiconductor laser apparatus of FIG. 1 comprises a semiconductor laser element 10, a collimator lens 12, a condenser lens 13, a narrow-band-pass filter 14, a waveguide-type optical wavelength conversion element 15, a mirror 20, and a driving circuit 40.

The semiconductor laser element 10 is an element which emits laser light, and is, for example, a semiconductor laser diode. The semiconductor laser element 10 is driven by the driving circuit 40. The collimator lens 12 collimates a divergent laser beam 11R emitted from the backward side of the semiconductor laser element 10, and the condenser lens 13 condenses the collimated laser beam. The narrow-band-pass filter 14 is arranged between the collimator lens 12 and the condenser lens 13, and functions as a wavelength selection element. The mirror 20 is arranged so that the laser beam condensed by the condenser lens 13 converges to a point on the surface of the mirror 20.

The forward-side end surface of the semiconductor laser element 10 is directly coupled to an end surface of the waveguide-type optical wavelength conversion element 15. The optical wavelength conversion element 15 is made by forming periodic domain-inverted structure and an optical channel waveguide 18 in a substrate 16. The substrate 16 is made of a $LiNbO_3$ crystal doped with 5 mol % MgO. The periodic domain-inverted structure includes periodically formed domain-inverted portions 17 in which the direction of spontaneous polarization, which is originally parallel with the z-axis of the substrate 16, is inverted. The optical channel waveguide 18 is formed along the periodic domain-inverted structure.

The periodic domain-inverted structure is formed so that the domain-inverted portions 17 are arranged along the x-axis of the substrate 16. The period Λ of the periodic domain-inverted structure is 4.75 μm, which is determined based on consideration of the chromatic dispersion of the refractive index of $LiNbO_3$, so as to be the first-order period for the wavelength in the vicinity of 950 nm. For example, the periodic domain-inverted structure can be formed by the method disclosed in Japanese Unexamined Patent Publication No. 6(1994)-242478.

For example, the optical channel waveguide 18 can be formed as follows.

After the periodic domain-inverted structure is formed as above, a metal mask pattern is formed on the +Z face of the substrate 16 by the known photolithography and lift-off technique. Next, the substrate 16 is immersed in pyrophosphoric acid, and undergoes a proton exchange process. Then, the mask is removed, and thereafter the substrate 16 undergoes an annealing process. Next, edge polishing is performed on both end surfaces 18a and 18b of the optical channel waveguide 18, and an antireflection (AR) coating 30 for the fundamental harmonic 11 of the semiconductor laser element 10 is provided on an end surface of the waveguide-type optical wavelength conversion element 15 which includes the end surface 18a of the optical channel waveguide 18, and an antireflection (AR) coating 31 for the second harmonic 19 of the laser light generated by the semiconductor laser element 10 is provided on the other end surface of the waveguide-type optical wavelength conversion element 15 which includes the end surface 18b of the optical channel waveguide 18. Thus, formation of the waveguide-type optical wavelength conversion element 15 is completed. Incidentally, low-reflection coatings for the oscillation wavelength of the semiconductor laser element 10 are provided on both end surfaces (cleavage planes) of the semiconductor laser element 10.

The operations of the semiconductor laser module of FIG. 1 are explained below.

The laser beam 11 which has the center wavelength of 950 cm, is emitted from the forward side of the semiconductor laser element 10, and enters the optical channel waveguide 18. The laser element 10 includes low reflection coatings 32 on either end. Then, the laser beam 11 propagates through the optical channel waveguide 18 in a TE mode, and is converted into the second harmonic 19 having the wavelength of 475 nm, which is one-half the center wavelength of the laser beam 11. In this case, phasematching (so-called pahse matching) is realized in the region of the periodic domain-inverted structure, and the second harmonic 19 also propagates through the optical channel waveguide 18 in a guided mode,and exits from the end surface 18b of the optical channel waveguide 18.

Although the divergent laser beam 11, which is not converted into the second harmonic, also exits from the end surface 18b of the optical channel waveguide 18, the second harmonic 19 can be separated from the divergent laser beam 11 by using a band-pass filter or dichroic mirror (not shown), so that users can utilize the second harmonic 19 for various purposes.

In the construction of FIG. 1, the backward emission light 11R, which is emitted from the backward side of the semiconductor laser element 10, is reflected by the mirror 20 so as to be fed back to semiconductor laser element 10. That is, in the construction of FIG. 1, an external resonator of the length L=50 mm is formed by the mirror 20 and the forward-side end surface of the semiconductor laser element 10.

Since the wavelength of the laser beam 11 is selected by the narrow-band-pass filter 14 arranged in the external resonator, laser oscillation in the semiconductor laser element 10 occurs at the selected wavelength. The selected wavelength varies with the rotation angle (in the direction A) of the narrow-band-pass filter 14. Therefore, by fixing the narrow-band-pass filter 14 at an appropriate angle, the wavelength of the laser beam 11 can be locked at a wavelength which corresponds to the period of the periodic domain-inverted structure, so as to realize the quasi phase matching of the second harmonic 19.

Figure 2:
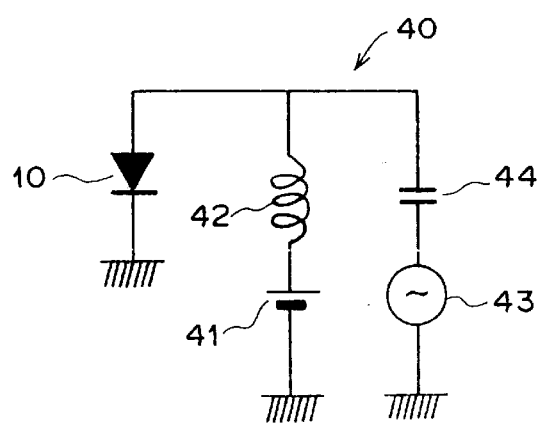
FIG. 2 is a diagram illustrating the construction of a semiconductor laser driving circuit in the construction of FIG. 1.

In the above construction, when a plurality of Fabry-Perot modes of the semiconductor laser element 10 exist within the width of the passband of the narrow-band-pass filter 14, the longitudinal mode competition can occur. In order to suppress the longitudinal mode competition, a driving circuit 40 for the semiconductor laser element 10 may be constructed, for example, as illustrated in FIG. 2. The driving circuit 40 of FIG. 2 has a so-called bias tee form, in which a high-frequency current source 43 (with a direct current blocking capacitor 44) is coupled to a direct current source 41 (with an RF blocking coil 42), so that a high-frequency current component of the driving current, which is generated by the high-frequency current source 43, is superimposed on a direct current component of the driving current, which is generated by the direct current source 41. The superimposed current is supplied to the semiconductor laser element 10. Instead of the driving circuit 40 of FIG. 2, a free-running oscillator may be provided for generating a high-frequency driving current. Alternatively, it is possible to use a self-pulsating (self-sustaining pulsation) laser diode as the semiconductor laser element 10.

Due to the superimposition of the high-frequency current on the driving current of the semiconductor laser element, the driving current does not stay in a region in which the longitudinal mode competition occurs. Therefore, the longitudinal mode competition can be suppressed, and the variation of the luminous energy of the second harmonic can also be suppressed. Incidentally, the semiconductor laser element 10 in the construction of FIG. 1 is such that laser oscillation can occur without the external resonator.

FIG. 4B is a graph illustrating an example of a waveform of the driving current of the semiconductor laser element 10, and FIG. 4A is a graph illustrating a relationship between the driving current and the output power of the fundamental harmonic of the semiconductor laser element 10. The characteristic of FIG. 4A is obtained, for example, by detecting the laser beam 11 with a photodiode, and observing the output of the photodiode with an oscilloscope or spectrum analyzer.

Figure 5:
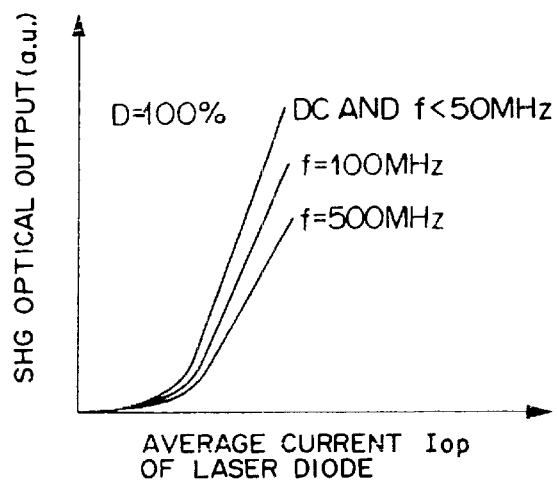
FIG. 5 shows graphs illustrating relationships between the average driving current of the semiconductor laser element and the output power of the second harmonic, in the cases where f<50 MHz, f=100 MHz, and f=200 MHz.
Figure 6:
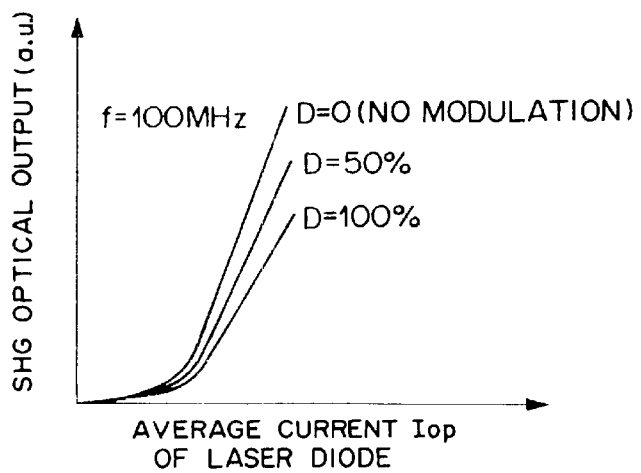
FIG. 6 shows graphs illustrating relationships between the average driving current of the semiconductor laser element and the output power of the second harmonic, in the cases where D=0, 50, and 100%.
Figure 7:
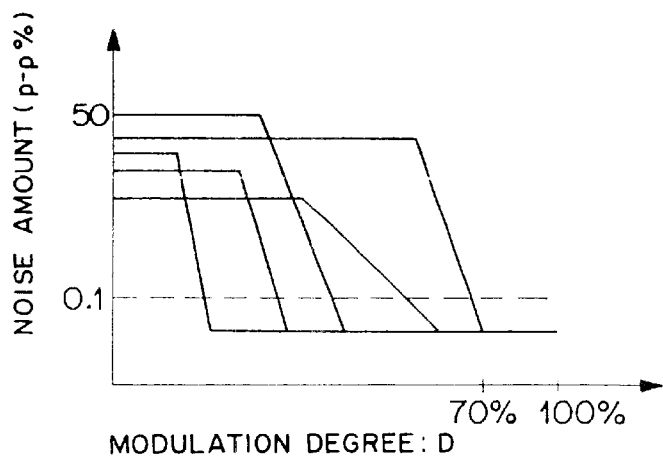
FIG. 7 shows graphs illustrating relationships between the degree of modulation and the amounts of noise (in peak-to-peak values) in five different semiconductor laser devices.

Preferable ranges of the frequency f of the high-frequency current and the degree D of modulation of the driving current with the high-frequency current are obtained based on the experiment results as illustrated in FIGS. 5, 6, and 7, where the degree D of modulation of the driving current with the high-frequency current is defined by the amplitude P1 of the high-frequency component of the driving current and the level P2 of the direct current component of the driving current, as D=P1/P2.

FIG. 5 shows graphs illustrating relationships between the average driving current $I_{OP}$ of the semiconductor laser element 10 and the output power (SHG optical output power) of the second harmonic 19, in the cases where the degree D of modulation of the driving current with the high-frequency current is 100%, and f<50 MHz, f=100 MHz, and f=200 MHz.

FIG. 6 shows graphs illustrating relationships between the average driving current of the semiconductor laser element 10 and the output power (SHG optical output power) $I_{OP}$ of the second harmonic 19, in the cases where the frequency f of the high-frequency current is 100 MHz, and D=0, 50, and 100%.

FIG. 7 shows graphs illustrating relationships between the degree D of modulation and the amounts of noise (in peak-to-peak values) in the second harmonic 19 in five different semiconductor laser elements 10 which are manufactured through identical processes. In FIG. 7, the amounts of noise are the maximum amounts of noise produced when the respective semiconductor laser elements are driven with a constant current, and the frequency f of the high-frequency current is 100 MHz.

The results of the experiments illustrated in FIGS. 5, 6, and 7 are analyzed below.

The external resonator oscillates at wavelengths at which the Fabry-Perot modes of the semiconductor laser element 10 and the oscillation modes of the external resonator coincide. For example, when the interval of the Fabry-Perot modes of the semiconductor laser element 10 is 0.2 nm, the frequency interval of the Fabry-Perot modes is 57 GHz. On the other hand, when the length of the external resonator is 50 mm, and the oscillation wavelength is 950 nm, the frequency interval of the oscillation modes of the external resonator is 3 GHz. Since the narrow-band-pass filter 14 having the passband of the 0.5 nm width (half-width) is inserted into the external resonator, normally, three longitudinal modes can exist in the external resonator. When the driving current is modulated under the above condition, side bands of the Fabry-Perot modes are generated, and cause spontaneously emitted light.

Since the peak widths of the Fabry-Perot modes in usual semiconductor laser devices are 10 MHz, the spontaneously emitted light increases when the semiconductor laser devices are driven with a high-frequency current having a frequency higher than 10 MHz. When the frequency f of the high-frequency current, which is superimposed on the driving current, is increased to 3 GHz, the above side bands overlap the oscillation modes of the external resonator, and therefore the spontaneously emitted light decreases. This phenomenon is usually called mode lock. However, since the electrical response time of the semiconductor laser element 10 used in this embodiment is about 2 GHz, the experiments of FIGS. 5, 6, and 7 have been performed for the frequencies up to 2 GHz. Therefore, no mode lock occurs. Since the spontaneously emitted light is not converted by the waveguide-type optical wavelength conversion element 15, the intensity of the second harmonic 19 decreases due to the generation of the spontaneously emitted light.

On the other hand, the amount of noise does not relate to the frequency f of the high-frequency current. Instead, the reduction rate of the amount of noise is determined by the degree D of modulation of the driving current, and the noise can be substantially suppressed when the degree D of modulation is 70% or more, as illustrated in FIG. 7. Therefore, it is most preferable that the frequency f of the high-frequency current is as low as possible, and the degree D of modulation of the driving current is 70% or more. However, the frequency f of the high-frequency current must be higher than an observable frequency of the noise. For example, when the above semiconductor laser element 10 is used in a high-speed laser printer, only noise in the frequency range of 10 MHz or less is significant since the time T for writing a pixel in the high-speed laser printer is about 100 n sec. Therefore, it is necessary to make the frequency f of the high-frequency current 10 MHz or more when the above semiconductor laser element 10 is used in the high-speed laser printer.

Although the results illustrated in FIG. 7 are obtained when the frequency f of the high-frequency current is 100 MHz, the characteristics of noise generation are substantially the same as those illustrated in FIG. 7 even when the frequency f of the high-frequency current is changed. This is because the longitudinal mode competition occurs only when the driving current has a specific value, and the driving current modulated with the high-frequency current passes through the specific value so quickly that no noise can be detected.

For the reasons described above, it is most preferable that the frequency f of the high-frequency current is in the range of 10 MHz to 50 MHz, and the degree D of modulation of the driving current is 70% or more.

In the above analysis, it is assumed that the high-frequency current has a sinusoidal waveform as illustrated in FIG. 4B. However, only the frequency of the high-frequency current is essential. Therefore, even in the case where the high-frequency current has a waveform other than the sinusoidal form, e.g., a rectangular form, the above analysis based on the frequency can be applied. In practice, the applicant has confirmed the effect of noise reduction in the case where the semiconductor laser device is driven by a pulsed current having the frequency components of 10 MHz or more and the modulation degree of 70% or more.

In addition, all of the contents of the Japanese Patent Application No. 11(1999)-141311 are incorporated into this specification by reference.

What is claimed is:

1. A semiconductor laser device comprising:
    a semiconductor laser element having a pair of end surface cleavage planes which allows therebetween laser oscillation in a plurality of Fabry-Perot modes;
    an external resonator being coupled to said semiconductor laser element via a first cleavage plane of said pair of cleavage planes of said semiconductor laser element, said external resonator including a wavelength selection element which has a passband including more than one wavelength of more than one Fabry-Perot mode out of said plurality of Fabry-Perot modes;
    a high-frequency superimposing unit which superimposes a high-frequency current on a driving current of said semiconductor laser element; and
    a current source supplying the driving current to the laser semiconductor element, said high-frequency driving superimposing unit the high-frequency current on an output of the current source.

2. A semiconductor laser device according to claim 1, wherein said high-frequency current is superimposed on said driving current with a modulation degree of 70 to 100%.

3. A semiconductor laser device according to claim 2, wherein said modulation degree is 100%.

4. A semiconductor laser device according to claim 1, wherein said high-frequency current has a frequency which is higher than a reciprocal of a cycle time for writing a pixel in an optical-scan type recording apparatus, and is lower than a response frequency of said semiconductor laser element.

5. A semiconductor laser device according to claim 4, wherein said high-frequency current has a frequency of 10 MHz to 2 GHz.

6. A semiconductor laser device according to claim 5, wherein said frequency is in the range of 10 MHz to 50 MHz.

7. A semiconductor laser device according to claim 2, wherein said high-frequency current has a frequency which is higher than a reciprocal of a cycle time for writing a pixel in an optical-scan type recording apparatus, and is lower than a response frequency of said semiconductor laser element.

8. A semiconductor laser device according to claim 7, wherein said high-frequency current has a frequency of 10 MHz to 2 GHz.

9. A semiconductor laser device according to claim 8, wherein said frequency is in the range of 10 MHz to 50 MHz.

10. A semiconductor laser device according to claim 3, wherein said high-frequency current has a frequency which is higher than a reciprocal of a cycle time for writing a pixel in an optical-scan type recording apparatus, and is lower than a response frequency of said semiconductor laser element.

11. A semiconductor laser device according to claim 10, wherein said high-frequency current has a frequency of 10 MHz to 2 GHz.

12. A semiconductor laser device according to claim 11, wherein said frequency is in the range of 10 MHz to 50 MHz.

13. The semiconductor laser device of claim 4, wherein the optical-scan type recording apparatus comprises a laser.

14. The semiconductor laser device of claim 1, wherein the optical-scan type recording apparatus comprises a laser.

15. The semiconductor laser device of claim 1, wherein the semiconductor laser element generates laser light in a plurality of longitudinal modes.

16. A semiconductor laser module comprising:

a semiconductor laser element having a pair of end surface cleavage planes which allow laser oscillation therebetween in a plurality of Fabry-Perot modes, and outputting laser light;

an external resonator being coupled to said semiconductor laser element via a first cleavage plane of said pair of cleavage planes of said semiconductor laser element, said external resonator including a wavelength selection element which has a passband including more than one wavelength of more than one Fabry-Perot mode out of said plurality of Fabry-Perot modes;

a high-frequency superimposing unit which superimposes a high-frequency current on a driving current of the semiconductor laser element;

a current source supplying the driving current to the laser semiconductor element, said high-frequency superimposing unit imposing the high-frequency current on an output of the current source; and an optical wavelength conversion element coupled to said first cleavage plane of the semiconductor laser element which performs wavelength conversion on said laser light to generate wavelength-converted laser light.

17. A semiconductor laser module according to claim 16, wherein said high-frequency current is superimposed on said driving current with a modulation degree of 70 to 100%.

18. A semiconductor laser module according to claim 17, wherein said modulation degree is 100%.

19. A semiconductor laser module according to claim 16, wherein said high-frequency current has a frequency which is higher than a reciprocal of a cycle time for writing a pixel in an optical-scan type recording apparatus, and is lower than a response frequency of said semiconductor laser element.

20. A semiconductor laser module according to claim 19, wherein said high-frequency current has a frequency of 10 MHz to 2 GHz.

21. A semiconductor laser module according to claim 20, wherein said frequency is in the range of 10 MHz to 50 MHz.

22. A semiconductor laser module according to claim 17, wherein said high-frequency current has a frequency which is higher than a reciprocal of a cycle time for writing a pixel in an optical-scan type recording apparatus, and is lower than a response frequency of said semiconductor laser element.

23. A semiconductor laser module according to claim 22, wherein said high-frequency current has a frequency of 10 MHz to 2 GHz.

24. A semiconductor laser module according to claims 23, wherein said frequency is in the range of 10 MHz to 50 MHz.

25. A semiconductor laser module according to claim 18, wherein said high-frequency current has a frequency which is higher than a reciprocal of a cycle time for writing a pixel in an optical-scan type recording apparatus, and is lower than a response frequency of said semiconductor laser element.

26. A semiconductor laser module according to claim 25, wherein said high-frequency current has a frequency of 10 MHz to 2 GHz.

27. A semiconductor laser module according to claim 26, wherein said frequency is in the range of 10 MHz to 50 MHz.

28. The semiconductor laser module of claim 16, wherein the semiconductor laser element generates laser light in a plurality of longitudinal modes.

* * * * *